(12) United States Patent
Yamaguchi et al.

(10) Patent No.: US 10,804,427 B2
(45) Date of Patent: *Oct. 13, 2020

(54) METHOD OF MANUFACTURING LIGHT-EMITTING ELEMENT

(71) Applicant: NICHIA CORPORATION, Anan, Tokushima (JP)

(72) Inventors: Kazuki Yamaguchi, Tokushima (JP); Haruki Takeda, Anan (JP); Yoshitaka Sumitomo, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/837,150

(22) Filed: Apr. 1, 2020

(65) Prior Publication Data
US 2020/0227587 A1 Jul. 16, 2020

Related U.S. Application Data

(63) Continuation of application No. 16/116,820, filed on Aug. 29, 2018, now Pat. No. 10,644,193.

(30) Foreign Application Priority Data

Aug. 30, 2017 (JP) .................................. 2017-165584

(51) Int. Cl.
H01L 21/301 (2006.01)
B23K 26/53 (2014.01)
(Continued)

(52) U.S. Cl.
CPC ...... H01L 33/0095 (2013.01); B23K 26/0622 (2015.10); B23K 26/08 (2013.01);
(Continued)

(58) Field of Classification Search
CPC ....... B23K 33/002; B23K 26/40; B23K 26/53
See application file for complete search history.

(56) References Cited

U.S. PATENT DOCUMENTS

2005/0227455 A1 10/2005 Park et al.
2007/0287267 A1 12/2007 Sakamoto et al.
(Continued)

FOREIGN PATENT DOCUMENTS

EP 2 402 984 A1 1/2012
JP 2005-286218 A 10/2005
(Continued)

OTHER PUBLICATIONS

Non-Final Office Action on U.S. Appl. No. 16/116,820 dated Aug. 16, 2019.
Notice of Allowance on U.S. Appl. No. 16/116,820 dated Jan. 14, 2020.

Primary Examiner — Brian Turner
(74) Attorney, Agent, or Firm — Foley & Lardner LLP

(57) ABSTRACT

A method of manufacturing a light-emitting element includes: providing a wafer including: a substrate, and a semiconductor structure; forming a plurality of modified regions inside the substrate of the wafer by irradiating the substrate with a laser beam; and separating the wafer into a plurality of light-emitting elements after said irradiating the substrate with the laser beam. Said forming the plurality of modified regions includes: scanning the laser beam along a plurality of first lines, the plurality of first lines extending in a first direction and being arranged in a second direction, the first direction being parallel to the first surface, the second direction intersecting the first direction and being parallel to the first surface, and scanning the laser beam along a plurality of second lines, the plurality of second lines extending in the second direction and being arranged in the first direction.

19 Claims, 5 Drawing Sheets

(51) Int. Cl.
   *B23K 26/08* (2014.01)
   *B23K 26/40* (2014.01)
   *H01L 21/263* (2006.01)
   *H01L 21/268* (2006.01)
   *H01L 33/00* (2010.01)
   *H01L 21/67* (2006.01)
   *B23K 26/364* (2014.01)
   *H01L 21/78* (2006.01)
   *B23K 26/0622* (2014.01)
   *B23K 101/40* (2006.01)
   *B23K 101/36* (2006.01)

(52) U.S. Cl.
   CPC ............ *B23K 26/364* (2015.10); *B23K 26/53* (2015.10); *H01L 21/67092* (2013.01); *H01L 21/67115* (2013.01); *H01L 21/78* (2013.01); *H01L 33/007* (2013.01); *B23K 2101/36* (2018.08); *B23K 2101/40* (2018.08)

(56) References Cited

U.S. PATENT DOCUMENTS

| | | |
|---|---|---|
| 2013/0040466 A1 | 2/2013 | Abe et al. |
| 2015/0136743 A1 | 5/2015 | Hosseini |
| 2015/0166394 A1 | 6/2015 | Marjanovic et al. |
| 2015/0343562 A1 | 12/2015 | Hirose et al. |
| 2017/0200855 A1 | 7/2017 | Tamemoto et al. |

FOREIGN PATENT DOCUMENTS

| | | |
|---|---|---|
| JP | 2008-078440 A | 4/2008 |
| JP | 5119463 B2 | 1/2013 |
| JP | 2013-051260 A | 3/2013 |
| JP | 2014-147946 A | 8/2014 |
| JP | 2015-122402 A | 7/2015 |
| JP | 2015-130470 A | 7/2015 |
| JP | 2017-084923 A | 5/2017 |
| WO | WO-2012/063348 A1 | 5/2012 |

METHOD OF MANUFACTURING LIGHT-EMITTING ELEMENT

CROSS-REFERENCE TO RELATED APPLICATIONS

The present application is a continuation of U.S. patent application Ser. No. 16/116,820, filed on Aug. 29, 2018, which claims priority to Japanese Patent Application No. 2017-165584, filed on Aug. 30, 2017, the contents of which are incorporated herein by reference in their entireties.

BACKGROUND

Embodiments described herein relate to a method of manufacturing a light-emitting element.

Forming element separation lines by performing laser irradiation in a method of manufacturing a light-emitting element in which a compound semiconductor to serve as a light-emitting layer is stacked on a substrate is proposed.

SUMMARY

Increase in productivity in the method of manufacturing the light-emitting element is desired. Certain embodiments of the present invention provide a method of manufacturing a light emitting device that allows for increasing productivity.

According to one embodiment, a method of manufacturing a light-emitting element includes forming a plurality of modified regions inside a substrate of a wafer by irradiating the substrate with a laser beam, the wafer comprising: the substrate having a first surface and a second surface, and a semiconductor structure disposed on the second surface of the substrate; and separating the wafer into a plurality of light-emitting elements after the step of irradiating laser beam. The step of forming the plurality of modified regions includes: scanning the laser beam along a plurality of first lines, the plurality of first lines extending in a first direction and being arranged in a second direction, the first direction being parallel to the first surface, the second direction intersecting the first direction and being parallel to the first surface, and scanning the laser beam along a plurality of second lines, the plurality of second lines extending in the second direction and being arranged in the first direction. A first interval, which is an interval between the plurality of first lines in the second direction, is larger than a second interval, which is an interval of the plurality of second lines in the first direction. During irradiating the laser beam along one of the plurality of first lines in the step of scanning the laser beam along the plurality of first lines, the laser beam is irradiated at a plurality of first positions that are arranged along the first direction, and a first irradiation interval, which is an interval between the plurality of first positions along the first direction, is 2.0 μm or less. The step of separating the wafer includes separating the wafer into a plurality of bars along the plurality of second lines. After separating the wafer into the plurality of bars, separating the bars into the plurality of light-emitting elements along the plurality of first lines.

A method of manufacturing a light emitting device according to one embodiment of the present invention allows for increasing productivity.

DETAILED DESCRIPTION

Figure 1:
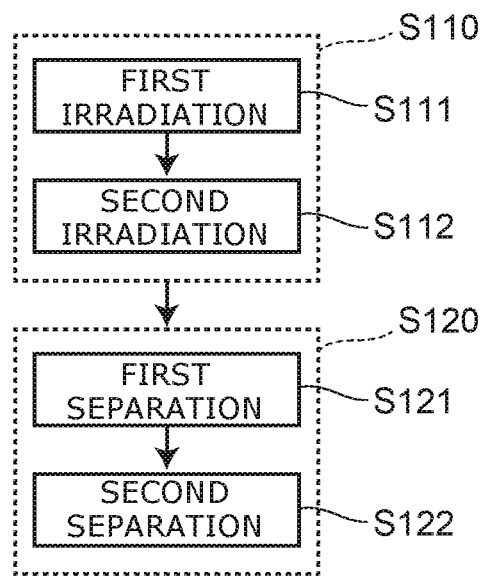
FIG. 1 is a flowchart illustrating a method of manufacturing a light-emitting element according to a first embodiment.

Certain embodiments of the present invention will be described hereinafter with reference to the accompanying drawings.

The drawings are schematic and illustrate technical ideas. In the drawings, relationships between the thickness and width of each portion, the proportions of sizes among corresponding portions, etc., may not be the same as that in an actual light emitting element. Further, the dimensions and proportions of the same portion may be illustrated differently among drawings.

In the specification and drawings of the present application, components similar to those in a drawing described earlier are indicated by the same reference numerals, and their detailed description may be omitted as appropriate.

FIG. 1 is a flowchart illustrating a method of manufacturing a light-emitting element according to a first embodiment.

Figure 2:
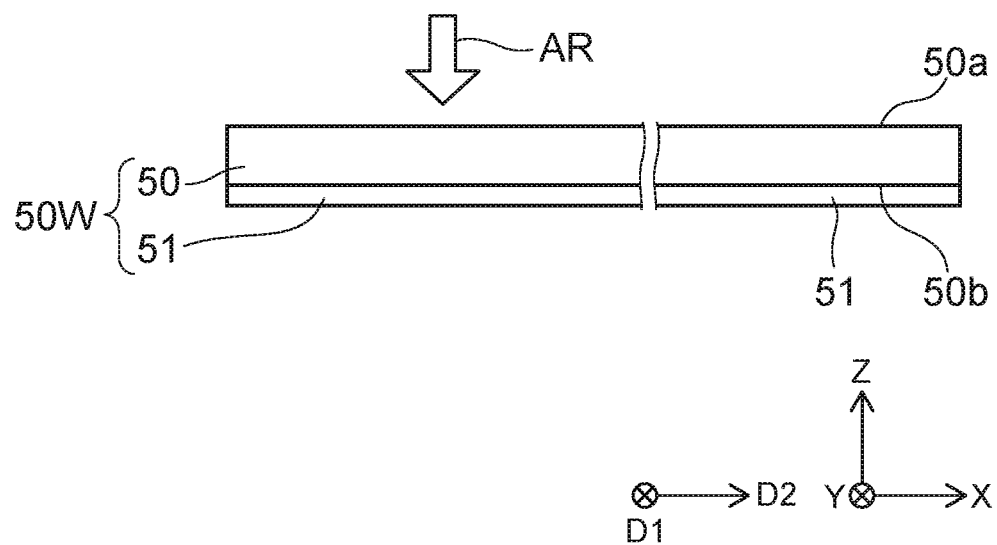
FIG. 2 is a schematic view illustrating a wafer used in the method of manufacturing the light-emitting element according to the first embodiment.
Figure 3:
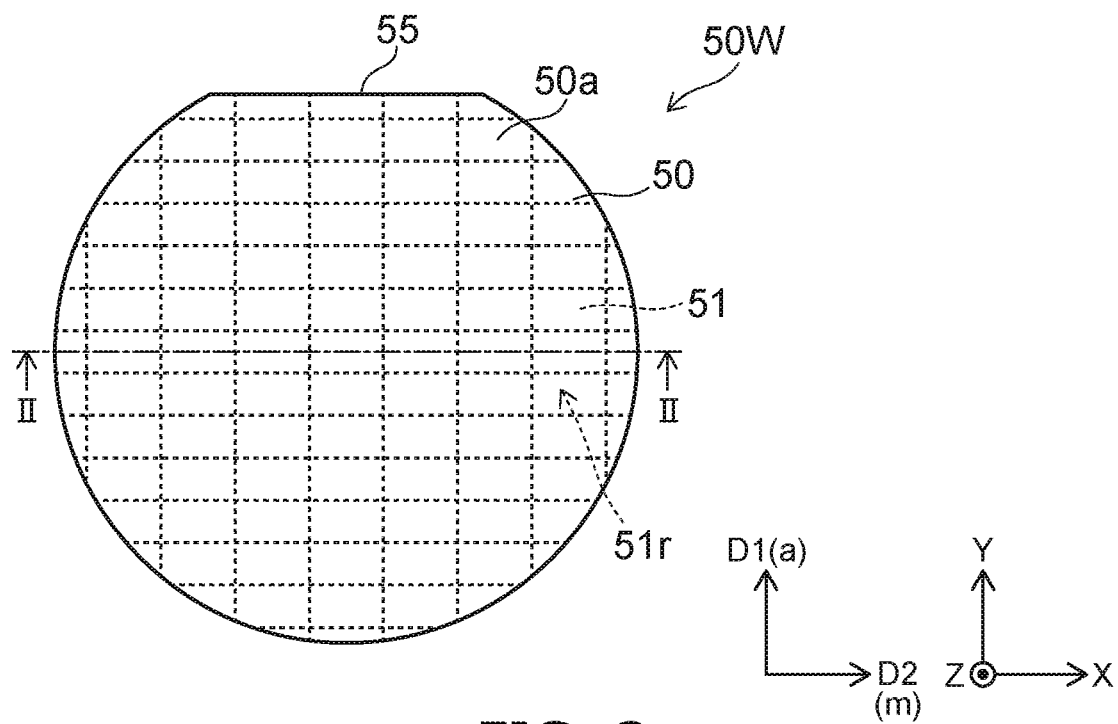
FIG. 3 is a schematic view illustrating a wafer used in the method of manufacturing the light-emitting element according to the first embodiment.

FIG. 2 and FIG. 3 are schematic views illustrating a wafer used in the method of manufacturing the light-emitting element according to the present embodiment. FIG. 2 is a cross-sectional view taken along a line II-II of FIG. 3. FIG. 3 is a plan view as viewed along arrow AR of FIG. 2.

As shown in FIG. 1, the method of manufacturing the light-emitting element according to the present embodiment includes irradiating a laser beam (step S110) and separating (step S120). The step of irradiating a laser beam includes carrying out a first irradiation (step S111) and carrying out a second irradiation (step S112). The step of separating includes carrying out a first separation (step S121) and carrying out a second separation (step S122).

A laser beam is irradiated on a wafer in the step of irradiating a laser beam. An example of the wafer will be described below.

As shown in FIG. 2 and FIG. 3, the wafer 50W includes a substrate 50 and a semiconductor structure 51.

The substrate 50 has a first surface 50a and a second surface 50b. The second surface 50b is the surface on the side opposite to the first surface 50a. For example, the semiconductor structure 51 is disposed on the second surface 50b.

The semiconductor structure 51 includes, for example, an n-type semiconductor layer, an active layer, and a p-type semiconductor layer. The n-type semiconductor layer is disposed between the p-type semiconductor layer and the substrate 50. The active layer is disposed between the p-type semiconductor layer and the n-type semiconductor layer. The semiconductor structure 51 includes, for example, a nitride semiconductor such as $In_xAl_yGa_{1-x-y}N$ ($0 \leq x$, $0 \leq y$, and $x+y<1$), etc. The peak wavelength of light emitted by the active layer is, for example, in a range of 360 nm to 650 nm.

The direction from the second surface 50b toward the first surface 50a is referred to as a "Z-axis direction." A direction perpendicular to the Z-axis direction is referred to as an "X-axis direction." A direction perpendicular to the Z-axis direction and the X-axis direction is referred to as a "Y-axis direction." The first surface 50a and the second surface 50b extend along the X-Y plane. The Z-axis direction corresponds to a thickness direction (e.g., the depth direction) of the substrate 50.

As shown in FIG. 3, the semiconductor structure 51 includes, for example, a plurality of regions 51r.

The plurality of regions 51r each correspond to one light-emitting element. The plurality of regions 51r are arranged in a first direction D1 and a second direction D2.

The first direction D1 is a direction parallel to the first surface 50a. The second direction D2 intersects the first direction D1 and is parallel to the first surface 50a. The second direction D2 is perpendicular to, for example, the first direction D1. In the example, the first direction D1 is aligned with the Y-axis direction. The second direction D2 is aligned with the X-axis direction.

The substrate 50 is made of, for example, sapphire. The substrate 50 is, for example, a sapphire substrate (e.g., a c-plane sapphire substrate). In the substrate 50, the first surface 50a may be tilted with respect to the c-plane. In the case in which the substrate 50 is a sapphire substrate, in one example, the first direction D1 is aligned with the a-axis of the sapphire substrate. In such a case, the second direction D2 is aligned with the m-axis of the sapphire substrate.

The substrate 50 includes an orientation flat 55. In the example, a direction in which the orientation flat 55 extends is aligned with the second direction D2 of the wafer 50W. In the present embodiment, any appropriate relationship is given between the first direction D1 and a direction in which the orientation flat 55 extends. Further, any appropriate relationship is given between the second direction D2 and the direction in which the orientation flat 55 extends.

A laser beam is irradiated on the wafer 50W having such a structure. The wafer 50W is separated along the boundaries of the plurality of regions 51r. A plurality of light-emitting elements is obtained from the plurality of regions 51r.

Figure 4:
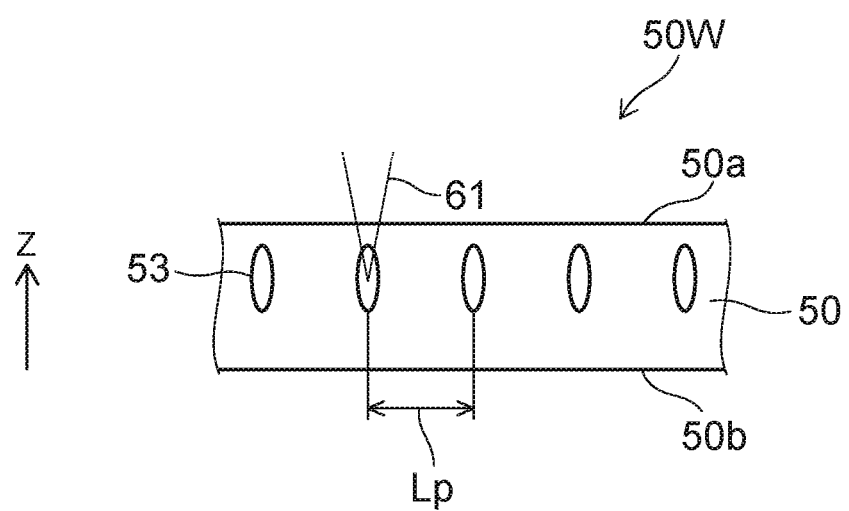
FIG. 4 is a schematic view illustrating a portion of the method of manufacturing the light-emitting element according to the first embodiment.

FIG. 4 is a schematic view illustrating a portion of the method of manufacturing the light-emitting element according to the present embodiment.

FIG. 4 illustrates the irradiation of the laser beam. As shown in FIG. 4, a laser beam 61 is irradiated on the substrate 50 of the wafer 50W. In the example, the laser beam 61 enters the substrate 50 through the first surface 50a.

The laser beam 61 is emitted in a pulse form. For example, a Nd:YAG laser, a titanium sapphire laser, a Nd:YVO4 laser, a Nd:YLF laser, or the like is used as the laser light source.

A wavelength of the laser beam 61 is a wavelength of a light passing through the substrate 50. Example of the laser beam 61 includes a laser beam having a peak wavelength in the range of 800 nm to 1200 nm.

The laser beam 61 is scanned along a direction parallel to the X-Y plane. For example, the relative positional relationship between the laser beam 61 and the substrate 50 is shifted along directions parallel to the X-Y plane. The positional relationship along the Z-axis direction (i.e., the positional relationship based on the substrate 50) of the light condensing point of the laser beam 61 may be shifted.

For example, the laser beam 61 is irradiated separately along a single direction aligned with the first surface 50a of the substrate 50. The plurality of portions where the laser beam 61 is irradiated are separated from each other along the single direction. The plurality of portions where the laser beam 61 is irradiated are aligned at an interval (i.e., a laser irradiation interval Lp). The laser irradiation interval Lp corresponds to the interval between the shots of the laser beam 61.

A plurality of modified regions 53 are formed inside the substrate 50 by the irradiation of the laser beam 61.

The laser beam 61 is concentrated at an inner portion of the substrate 50. The energy of the laser beam 61 is concentrated at a designated depth inside the substrate 50. Accordingly, the plurality of modified regions 53 are formed. The interval of the light condensing points of the laser beam 61 when forming the plurality of modified regions 53 corresponds to the laser irradiation interval Lp. The modified regions 53 are, for example, regions embrittled due to the laser irradiation inside the substrate 50.

For example, a crack propagates from the plurality of modified regions 53. The crack extends in the Z-axis direction of the substrate 50. Separation of the substrate 50 starts from the crack.

For example, in a step of separating described below, a force (e.g., a load, an impact, or the like) is applied, and the substrate 50 is separated based on the crack.

Thus, in the step of irradiating a laser beam (step S110), the laser beam 61 is irradiated on the substrate 50, and the plurality of modified regions 53 are formed inside the substrate 50. For example, the laser irradiation is performed along the first direction D1 and the second direction D2.

Then, in the step of separating (step S120), the wafer 50W is separated into a plurality of light-emitting elements after the step of irradiating a laser beam. For example, the wafer 50W is separated into the plurality of light-emitting elements by performing separation along two directions.

An example of the step of irradiating the laser beam will be described.

Figure 5:
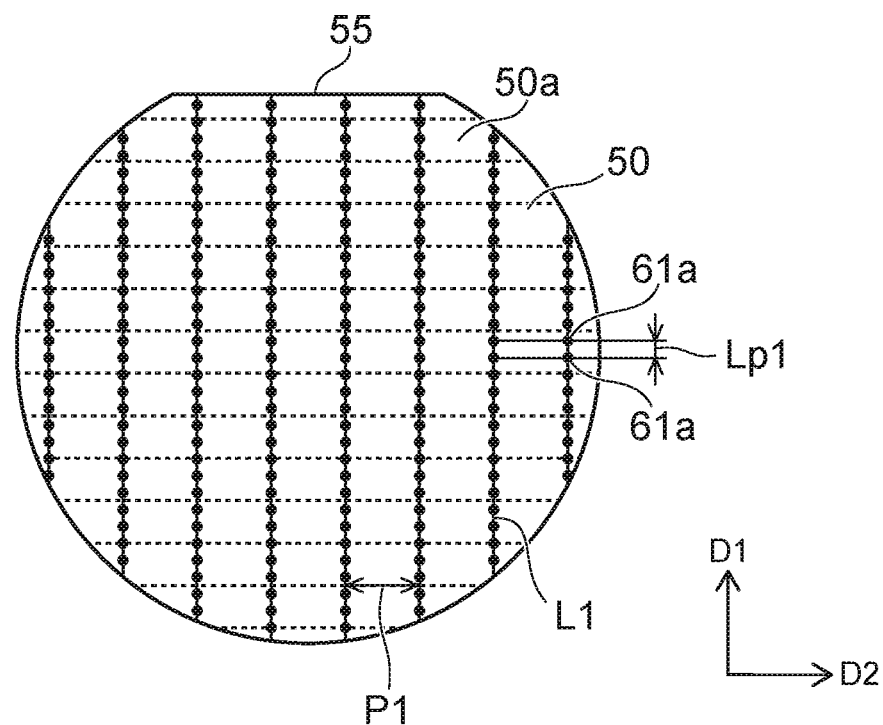
FIG. 5 is a schematic plan view illustrating a portion of the method of manufacturing the light-emitting element according to the first embodiment.

FIG. 5 is a schematic plan view illustrating a portion of the method of manufacturing the light-emitting element according to the present embodiment.

FIG. 5 illustrates the step of carrying out the first irradiation (step S111). As shown in FIG. 5, the laser beam 61 is scanned along a plurality of first lines L1 in step of carrying out the first irradiation.

The plurality of first lines L1 extend in the first direction D1 and are arranged in the second direction D2. As described above, the first direction D1 is parallel to the first surface 50a. The second direction D2 intersects the first direction D1 and is parallel to the first surface 50a. The plurality of first lines L1 are arranged at a first interval P1. The first interval P1 is a distance along the second direction D2 between two first lines L1 adjacent to each other in the second direction D2.

For example, the plurality of first lines L1 are aligned with the boundaries between the plurality of regions 51r arranged in the second direction D2 (referring to FIG. 3).

As shown in FIG. 5, the laser beam 61 is irradiated at plurality of first positions 61a in the irradiation of the laser beam 61 along one of the plurality of first lines L1. The plurality of first positions 61a are arranged along the first direction D1. The interval of the plurality of first positions 61a corresponds to a first irradiation interval Lp1. The first irradiation interval Lp1 is the distance along the first direction D1 between two first positions 61a adjacent to each other in the first direction D1.

In the present embodiment, the first irradiation interval Lp1 is, for example, 2.0 µm or less. With such an interval, a breaking strength in the step of separating process can be increased sufficiently as described below in detail.

Figure 6:
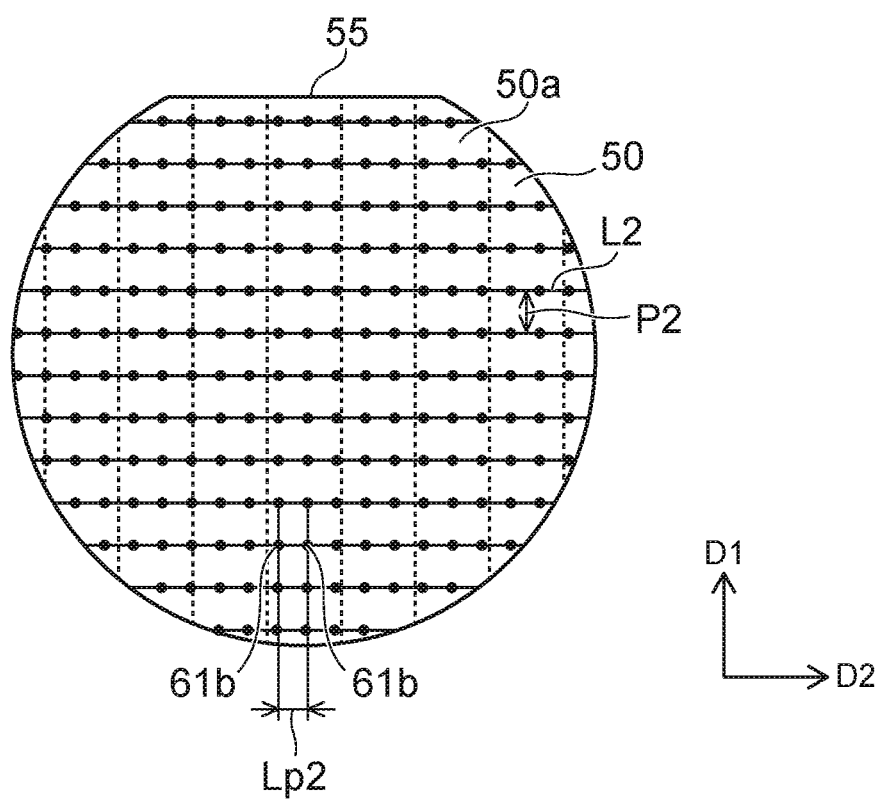
FIG. 6 is a schematic plan view illustrating a portion of the method of manufacturing the light-emitting element according to the first embodiment.

FIG. 6 is a schematic plan view illustrating a part of the method of manufacturing the light-emitting element according to the present embodiment.

FIG. 6 illustrates the step of carrying out second irradiation (step S112). As shown in FIG. 6, the laser beam 61 is scanned along plurality of second lines L2 in the step of carrying out second irradiation.

The plurality of second lines L2 extend in the second direction D2. The plurality of second lines L2 are arranged at a second interval P2 in the first direction D1. The second interval P2 is the distance along the first direction D1 between two second lines L2 adjacent to each other in the first direction D1.

For example, the plurality of second lines L2 are aligned with the boundaries between the plurality of regions 51r arranged in the first direction D1 (referring to FIG. 3).

The laser beam 61 is irradiated at a plurality of second positions 61b in the irradiation of the laser beam 61 along each of the plurality of second lines L2 in the second irradiation process. The plurality of second positions 61b are arranged along the second direction D2. The interval of the plurality of second positions 61b corresponds to a second irradiation interval Lp2. The second irradiation interval Lp2 is the distance along the second direction D2 between two second positions 61b adjacent to each other in the second direction D2.

In one example, the first irradiation interval Lp1 is smaller than the second irradiation interval Lp2. This allows for reducing unintentional separation of the wafer in the step of separating, as described below.

In the present embodiment, the first interval P1 (referring to FIG. 5) is larger than the second interval P2 (referring to FIG. 6).

An example of the step of separating will be described below.

Figure 7:
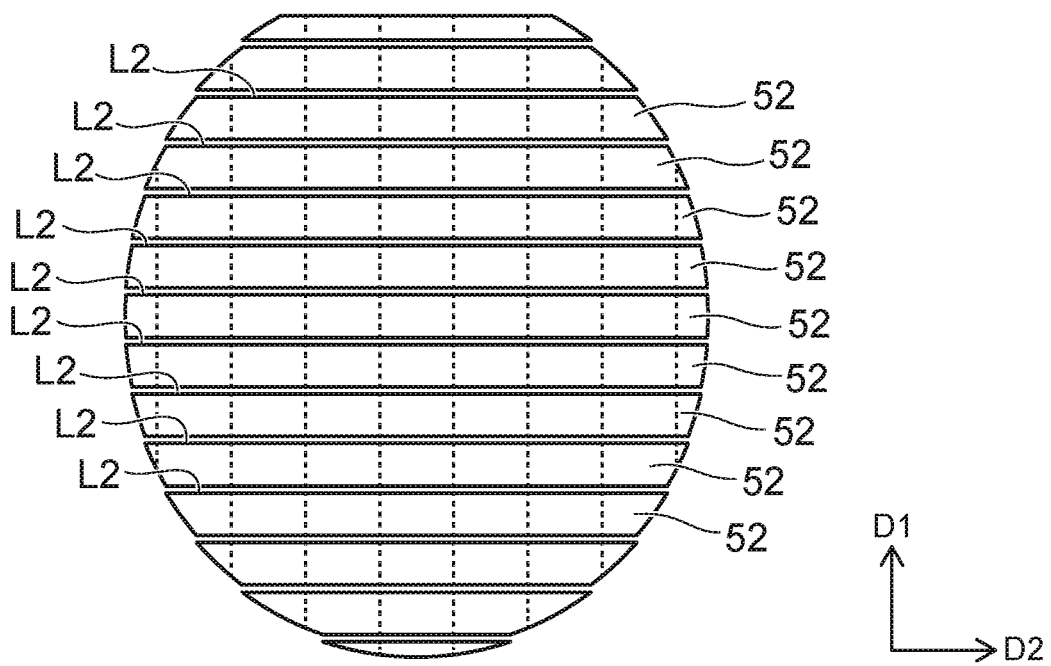
FIG. 7 is a schematic plan view illustrating a portion of the method of manufacturing the light-emitting element according to the first embodiment.

FIG. 7 is a schematic plan view illustrating a part of the method of manufacturing the light-emitting element according to the present embodiment.

FIG. 7 illustrates the step of carrying out first separation. In the first separation, the wafer 50W is separated into plurality of bars 52 along the plurality of second lines L2. For example, the wafer 50W is separated into the plurality of bars 52 by applying a load to the wafer 50W along the second lines L2 using a blade. In the present embodiment, in a single bar 52, the plurality of regions 51r are arranged in the second direction D2.

Figure 8:
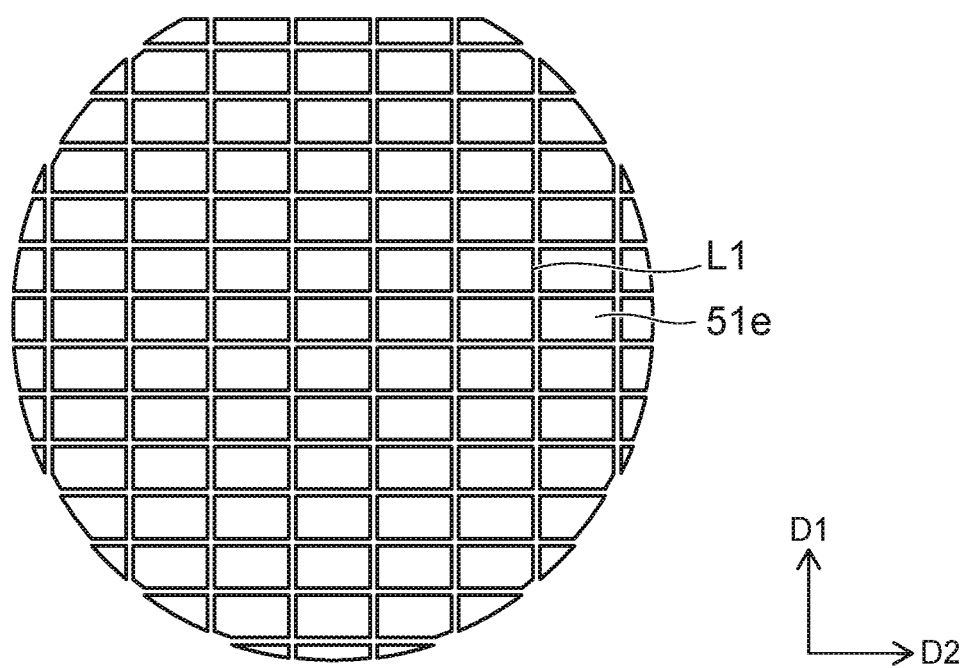
FIG. 8 is a schematic plan view illustrating a portion of the method of manufacturing the light-emitting element according to the first embodiment.

FIG. 8 is a schematic plan view illustrating a part of the method of manufacturing the light-emitting element according to the present embodiment.

FIG. 8 illustrates the step of carrying out second separation. The second separation is carried out after carrying out the first separation. In the step of carrying out the second separation, the bars 52 are separated into a plurality of light-emitting elements 51e along the plurality of first lines L1 after the step of carrying out first separation. For example, the bars 52 are separated into the plurality of light-emitting elements 51e by applying a load to the bars 52 (i.e., the wafer 50W) along the first direction D1 using a blade.

The first and second separation as described above is carried out by cleaving, for example.

In the present embodiment as described above, the first interval P1 is larger than the second interval P2.

In each of the plurality of light-emitting elements 51e obtained by the method of manufacturing as described above, the length along the second direction D2 is longer than the length along the first direction D1. Each of the plurality of light-emitting elements 51e has a long side and a short side. A length of the long side substantially corresponds to the first interval P1. A length of the short side corresponds to the second interval P2.

In the present embodiment, the step of carrying out second separation is performed after carrying out the first separation. For example, a separation along singulation lines that extend along the long sides (i.e., the second lines L2) is carried out, and then the separation along the singulation lines that extend along the short sides (i.e., the first lines L1) is carried out.

Alternatively, the separation along the second lines L2 can be carried out after the separation along the first lines L1. In such a case, carrying out the separation along the second lines L2 tends to be difficult after the separation along the first lines L1.

That is, it is not easy to carry out the separation along the singulation lines along the long sides of the plurality of light-emitting elements 51e after the separation along the singulation lines along the short sides of the plurality of light-emitting elements 51e. This is because separation along the long sides of the plurality of light-emitting elements 51e is finer than separation along the short sides of the plurality of light-emitting elements 51e, and thus the wafer that has been separated along the short sides is not easily further separated along the long sides compared to the case in which the wafer that has been separated along the long sides is further separated along the short sides.

In the present embodiment, the second separation is carried out after carrying out the first separation. This allows for facilitating separation of the substrate 50 into the plurality of light-emitting elements.

Compared to the separation along the singulation lines that extend along the short sides, unintentional separation occurs along the short sides easily when separation is carried out along the singulation lines that extend along the long sides. That is, unintentional separation occurs more easily in the short sides than in the long sides. According to the present embodiment, unintentional separation in the short sides during separation along the singulation lines that extend along the long sides can be reduced.

Further, in the present embodiment, the first irradiation interval Lp1 that is aligned with the first lines L1 is 2.0 µm or less, which is small. With such an interval, an unintentional separation along the first lines L1 during the first separation can be reduced.

As described below, reduction in the first irradiation interval Lp1 allows for increasing the breaking strength along the first lines L1. Accordingly, for example, the separation along the first lines L1 does not occur easily. For example, the occurrence of unintentional separation due to an impact in the first separation can be reduced further.

In the present embodiment, the laser beam 61 is irradiated at the second irradiation interval Lp2 in the irradiation of the laser beam 61 in the second irradiation. In the present embodiment, it is favorable for the second irradiation interval Lp2 to be larger than the first irradiation interval Lp1.

With a larger second irradiation interval Lp2, a breaking strength along the second lines L2 in the irradiation of the laser beam 61 along the second lines L2 can be reduced. Accordingly, the separation along the second lines L2 can be facilitated.

For example, in the separation along the second lines L2 (i.e., the first separation), the separation along the second lines L2 can be carried out even with a smaller load obtained by the blade or the like. Because the separation along the second lines L2 can be carried out by a smaller load, the load that is applied to the first lines L1 can be also reduced; and the occurrence of the unintentional separation along the first lines L1 can be reduced further.

For example, the second irradiation interval Lp2 is, for example, in a range of 3.0 µm to 3.5 µm. With such a second irradiation interval Lp2, occurrence of the unintentional separation can be reduced stably.

For example, unintentional separation occurs during two steps of separation along two directions by, for example, application of an uneven load to the substrate 50. Due to an unintentional separation, defects such as chipping of the substrate occur. In the present embodiment, as a condition of one of the first and second laser irradiation, a condition with which a separation is less easily achieved than with a condition of the other of the first and second laser irradiation is employed. With such a condition, an unintentional separation can be reduced.

In two separations along two directions, ease of separation along one of the first and second direction may be different from ease of separation along the other of the first and second direction. For example, ease of separation may be different in accordance with the crystal orientation of the substrate 50.

There is a reference example in which the difference between the ease of separations are aimed to be reduced in such a case.

On the other hand, in the present embodiment, as the condition of one of the first and second laser irradiation, a condition with which a separation is less easily achieved than with a condition of the other of the first and second laser irradiation can be employed. In other words, the first irradiation interval Lp1 in the first laser irradiation is set to be smaller than the second irradiation interval Lp2 in the second laser irradiation process. With the plurality of modified regions 53 formed in the first laser irradiation process, the separation along the first lines L1 is not easily carried out. Accordingly, portions to be separated in the second separation can be prevented from being unintentionally separated during first separation.

In the first embodiment, when the first separation and the second separation are performed, the laser irradiation interval Lp is set appropriately in accordance with the order of the separation (i.e., the cleaving). This allows for reducing an unintentional separation.

According to the present embodiment, a method of manufacturing a light-emitting element can be provided in which the productivity can be increased.

Results of an experiment related to a breaking strength of the wafer 50W after the laser irradiation will be described. A sample used in the experiment includes the substrate 50 (the sapphire substrate) and the semiconductor structure 51 in which nitride semiconductors are stacked (referring to FIG. 2). A thickness of the sample is approximately 120 µm. The sample has a planar shape of a rectangle, and a main surface of the sample has one side (i.e., the long side) with a length of 2200 µm and another side (i.e., the short side) with a length of 2000 µm. The laser beam 61 is irradiated on the sample along a center line parallel to the long side of the sample. In the experiment, the laser irradiation interval Lp is changed in a range of 1 µm to 3.5 µm for each 0.5 µm. In the experiment, two types of conditions, i.e., the case in which the laser beam 61 is irradiated along the m-axis of the sapphire substrate and the case in which the laser beam 61 is irradiated along the a-axis of the sapphire substrate, are employed. The pulse period of the laser beam 61 is constant; and the laser irradiation interval Lp is changed by changing the scan rate of the laser beam 61. The laser beam 61 is emitted from a YAG laser. The wavelength of the laser beam 61 is 1040 nm.

The breaking strength was measured for samples in which the laser beam 61 was irradiated at the various laser irradiation intervals Lp. A bending test was conducted for the measurement of the breaking strength. A bending load was applied to the sample at three points, and the load that caused breaking was determined as the breaking strength.

Figure 9:
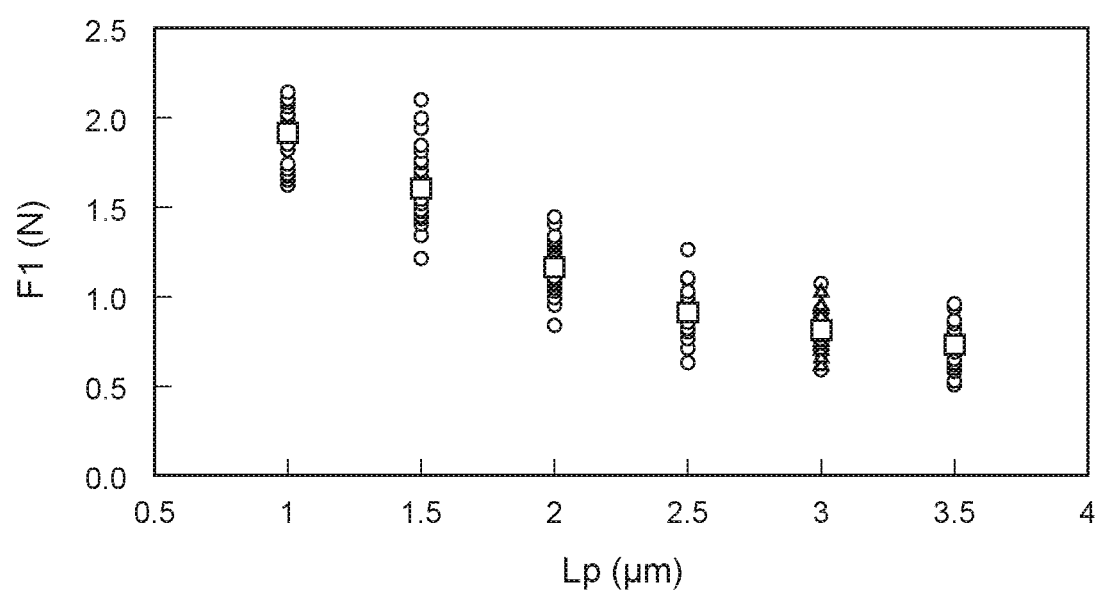
FIG. 9 is a graph illustrating a result of an experiment related to separation of light emitting elements.

FIG. 9 is a graph illustrating the result of the experiment relating to the separation of the light-emitting elements.

The horizontal axis of FIG. 9 indicates the laser irradiation interval Lp (in µm). The vertical axis of FIG. 9 indicates a breaking strength F1 (in newtons (N)). In FIG. 9, the values of the breaking strength F1 when the laser beam 61 is irradiated along the a-axis direction are indicated by round symbols. The values of the breaking strength F1 when the laser beam 61 is irradiated along the m-axis is indicated by triangular symbols. The average value of the values of the breaking strength F1 when the laser beam 61 is irradiated along the a-axis direction is indicated by square symbols.

As shown in FIG. 9, the breaking strength F1 is increased when the laser irradiation interval Lp is reduced. From the result in FIG. 9, when the laser irradiation interval Lp is 3 µm, substantially similar tendencies are observed for the laser irradiation along the m-axis direction and the laser irradiation along the a-axis.

It can be seen from FIG. 9 that the breaking strength F1 started to increase when the laser irradiation interval Lp is 2.5 µm or less. The breaking strength F1 was greatly increased when the laser irradiation interval Lp is 2.0 µm or less. On the other hand, the breaking strength F1 was stably reduced when the laser irradiation interval Lp was in a range of 3.0 µm to 3.5 µm.

In view of the description above, it is preferable for the first irradiation interval Lp1 to be 2.0 µm or less. It is preferable for the second irradiation interval Lp2 to be 3.0 µm or more (3.5 µm or less). With such intervals, there is a large difference between the fracture strength F1 of the first laser irradiation and the fracture strength F1 of the second laser irradiation.

It can be seen from FIG. 9 that the minimum value of the breaking strength F1 when the laser irradiation interval Lp is 1.5 µm or less is greater than the maximum value when the laser irradiation interval Lp is 3.0 µm or more.

Therefore, it is more preferable for the first irradiation interval Lp1 to be 1.5 µm or less. Thereby, even when variations are taken into consideration, a sufficient difference is obtained for the fracture strength F1.

Thus, in the present embodiment, the laser irradiation interval Lp is selected appropriately in accordance with the order of separations (i.e., cleavings). This allows for reducing unintentional separation.

The inventors had previously assumed that reduction in intervals of the laser irradiation would facilitate breakage of a substrate. However, as described above, it was found that reduction in intervals of the laser irradiation increases the breaking strength F1, which allows the substrate to be not easily separated. It is considered that the separation does not occur easily because the plurality of modified regions are formed densely at the inner portion of the substrate along the scanning line of the laser beam, and overlapping of the plurality of modified regions with each other allows for reducing separation of the substrate.

In the present embodiment, it is preferable for the second interval P2 to be 300 µm or more. For example, with the second interval P2 of less than 300 µm, an unintentional separation tends to easily occur along the first lines L1 during the first separation. In the present embodiment, with the first irradiation interval Lp1 of a predetermined value, the unintentional separation can be reduced even in the case in which the second interval P2 is 300 µm or less.

In the present embodiment, it is preferable for the first interval P1 to be 1 mm or more, and more preferably to be in a range of 1 mm to 3 mm.

In the present embodiment, it is preferable for the output of the laser beam 61 in the step of carrying out the first irradiation and the step of carrying out the second irradiation to be in a range of 100 mW to 150 mW. With the output higher than 150 mW, for example, damage may occur in the semiconductor structure 51 (e.g., in the light-emitting elements 51e). With the output lower than 100 mW, for example, the modified regions 53 are not formed easily, or the crack does not extend easily from the modified regions 53. Therefore, the separation of the substrate 50 may be difficult. With the output in a range 100 mW to 150 mW, for example, separation can be facilitated while reducing damage of the semiconductor structure 51.

In the present embodiment, it is preferable for the second irradiation to be carried out after the first irradiation.

As described above, the first interval P1 of the plurality of first lines L1 in the first irradiation is larger than the second interval P2 of the plurality of second lines L2 in the second irradiation. For example, the number of the plurality of first lines L1 per unit surface area is smaller than the number of the plurality of second lines L2 per unit surface area.

As described above, the plurality of modified regions 53 are formed by the irradiation of the laser beam 61; the crack that occurs from the plurality of modified regions 53 propagates; and the substrate 50 is separated. With a greater number of times of scanning of the laser beam 61, the number of the modified regions 53 also increased easily, and the stress (e.g., the compressing stress) at the inside of the substrate 50 is increased. In the state in which the compressive stress at the inside of the substrate 50 is increased, even if the modified regions 53 are formed, the crack that occurs from the modified regions 53 does not extend easily. Therefore, the substrate 50 is not easily separated. Reduction in compressive stress of the interior of the substrate 50 allows for facilitating separation of the substrate 50.

By carrying out the first irradiation, in which the number of scans is smaller, earlier, the second irradiation can be carried out in a state in which the compressive stress inside the substrate is relatively small. For example, in the case in which the first irradiation, in which the number of scans is smaller, is carried out after the second irradiation, in which the number of scans is larger, the first irradiation is carried out in a state in which a strong compressing stress acts. In such a case, even if the modified regions 53 are formed in the step of carrying out the first irradiation, the crack does not extend easily; therefore, it is not easy to perform the cleavage of the substrate. In the present embodiment, difficulty in extension of the crack from the modified regions obtained by the first irradiation and the second irradiation can be reduced. Accordingly, the substrate 50 is separated easily.

Example

In one example, the wafer 50W in which the semiconductor structure 51 that includes a nitride semiconductor was disposed on a sapphire substrate is provided. A thickness of the sapphire substrate is 120 µm. The wavelength of the laser beam 61 is approximately 1060 nm. The output of the laser beam 61 is approximately in a range of 100 mW to 150 mW.

In the step of irradiating laser beam, the first direction D1 is parallel to the a-axis of the sapphire substrate. The second direction D2 is parallel to the m-axis of the sapphire substrate. The first interval P1 is 1100 µm. The second interval P2 is 200 µm. In a first condition, the first irradiation interval Lp1 is 1.5 µm; and the second irradiation interval Lp2 is 3.0 µm.

In the step of performing separation, the first separation was carried out along the second lines L2; subsequently, the second separation process was carried out along the first lines L1.

Among obtained light emitting elements, light emitting elements in which chipping or the like occurs due to unintentional breaking was determined to be poor quality. In the example, the ratio of light emitting elements of poor quality was 0.5%.

Reference Example

In a reference example, the first irradiation interval Lp1 is 3.0 µm. The other conditions of the reference example are the same as those of the example described above. In the reference example, the ratio of light emitting elements of poor quality was 2.0%. According to the manufacturing method of the example, the ratio of light emitting elements of poor quality can be reduced, and productivity can be increased.

According to certain embodiments, a method of manufacturing a light-emitting element can be provided in which the productivity can be increased.

In the specification of the application, "perpendicular" and "parallel" refer to not only strictly perpendicular and strictly parallel but also include, for example, a slight deviation from strictly perpendicular and strictly parallel due to manufacturing processes, etc. That is, the terms "perpendicular" and "parallel" encompass substantially perpendicular and substantially parallel configurations, respectively.

Exemplary embodiments of the invention are described above with reference to specific examples. However, the scope of the invention is not limited to those specific examples. For example, specific configurations of wafers, substrates, semiconductor structures, light-emitting elements, lasers, etc., that are used in manufacturing of a light emitting element may be appropriately selected from known art by a person skilled in the art, and variations of such specific configurations are included in the scope of the present invention as long as a person skilled in the art can similarly implement the invention and similar effects can be obtained.

Further, combination of any two or more components of the specific examples within the extent of being technically possible can be included in the scope of the invention as long as the combination does not depart from the spirit of the invention.

Moreover, all methods of manufacturing light-emitting elements that are appropriately modified by a person skilled in the art from the methods of manufacturing light-emitting elements described above as certain embodiments of the invention also are within the scope of the invention as long as the modified method does not depart from the spirit of the invention.

Various other variations and modifications can be made by those skilled in the art within the spirit of the invention, and it is understood that such variations and modifications are also encompassed within the scope of the invention.

What is claimed is:

1. A method of manufacturing a light-emitting element, the method comprising:
   providing a wafer comprising:
      a substrate having a first surface and a second surface, and
      a semiconductor structure disposed on the second surface of the substrate;
   forming a plurality of modified regions inside the substrate of the wafer by irradiating the substrate with a laser beam; and
   separating the wafer into a plurality of light-emitting elements after said irradiating the substrate with the laser beam;
   wherein said forming the plurality of modified regions includes:
      scanning the laser beam along a plurality of first lines, the plurality of first lines extending in a first direction and being arranged in a second direction, the first direction being parallel to the first surface, the second direction intersecting the first direction and being parallel to the first surface, and
      scanning the laser beam along a plurality of second lines, the plurality of second lines extending in the second direction and being arranged in the first direction;
   wherein a first interval, which is an interval between the plurality of first lines in the second direction, is larger than a second interval, which is an interval of the plurality of second lines in the first direction, such that the plurality of first lines and the plurality of second lines form a plurality of elongated rectangular areas, each having long sides formed by the plurality second lines and short sides formed by the plurality of first lines;
   wherein, during irradiating the laser beam along one of the plurality of first lines in said scanning the laser beam along the plurality of first lines, the laser beam is irradiated at a plurality of first positions that are arranged along the first direction, and a first irradiation interval, which is an interval between the plurality of first positions along the first direction, is 2.0 µm or less
   wherein said separating the wafer includes:
      separating the wafer into a plurality of elongated bars along the plurality of second lines forming the long sides of the plurality of elongated rectangular areas, and
      after said separating the wafer into the plurality of elongated bars, separating the elongated bars into the plurality of light-emitting elements along the plurality of first lines forming the short sides of the plurality of elongated rectangular areas.

2. The method of manufacturing the light-emitting element according to claim 1, wherein the second interval is 300 µm or less.

3. The method of manufacturing the light-emitting element according to claim 1, wherein an output of the laser beam in the step of scanning the laser beam along the plurality of first lines, and the step of scanning the laser beam along the plurality of second lines is in a range of 100 mW to 150 mW.

4. The method of manufacturing the light-emitting element according to claim 2, wherein an output of the laser beam in the step of scanning the laser beam along the plurality of first lines, and the step of scanning the laser beam along the plurality of second lines is in a range of 100 mW to 150 mW.

5. The method of manufacturing the light-emitting element according to claim 1, wherein the step of scanning the laser beam along the plurality of second lines is performed after the step of scanning the laser beam along a plurality of first lines.

6. The method of manufacturing the light-emitting element according to claim 2, wherein the step of scanning the laser beam along the plurality of second lines is performed after the step of scanning the laser beam along a plurality of first lines.

7. The method of manufacturing the light-emitting element according to claim 3, wherein the step of scanning the laser beam along the plurality of second lines is performed after the step of scanning the laser beam along a plurality of first lines.

8. The method of manufacturing the light-emitting element according to claim 1, wherein the substrate is made of sapphire.

9. The method of manufacturing the light-emitting element according to claim 2, wherein the substrate is made of sapphire.

10. The method of manufacturing the light-emitting element according to claim 3, wherein the substrate is made of sapphire.

11. The method of manufacturing the light-emitting element according to claim 5, wherein the substrate is made of sapphire.

12. The method of manufacturing a light emitting element according to claim 8, wherein the first direction extends along an a-axis of the sapphire, and the second direction extends along a m-axis of the sapphire.

13. The method of manufacturing a light emitting element according to claim 9, wherein the first direction extends along an a-axis of the sapphire, and the second direction extends along a m-axis of the sapphire.

14. The method of manufacturing a light emitting element according to claim 10, wherein the first direction extends along an a-axis of the sapphire, and the second direction extends along a m-axis of the sapphire.

15. The method of manufacturing a light emitting element according to claim 11, wherein the first direction extends along an a-axis of the sapphire, and the second direction extends along a m-axis of the sapphire.

16. The method of manufacturing the light-emitting element according to claim 1, wherein the first interval is 1 mm or more.

17. The method of manufacturing the light-emitting element according to claim 2, wherein the first interval is 1 mm or more.

18. The method of manufacturing the light-emitting element according to claim 3, wherein the first interval is 1 mm or more.

19. The method of manufacturing the light-emitting element according to claim 5, wherein the first interval is 1 mm or more.

\* \* \* \* \*